(12) United States Patent
Russell

(10) Patent No.: US 9,978,702 B2
(45) Date of Patent: May 22, 2018

(54) RESURFACEABLE CONTACT PAD FOR SILICON OR ORGANIC REDISTRIBUTION INTERPOSER FOR SEMICONDUCTOR PROBING

(71) Applicant: R&D CIRCUITS, INC., South Plainfield, NJ (US)

(72) Inventor: James V Russell, New Hope, PA (US)

(73) Assignee: RGD Circuts, Inc., South Plainfield, NJ (US)

( * ) Notice: Subject to any disclaimer, the term of this patent is extended or adjusted under 35 U.S.C. 154(b) by 0 days. days.

(21) Appl. No.: 15/151,658

(22) Filed: May 11, 2016

(65) Prior Publication Data

US 2018/0033748 A1    Feb. 1, 2018

(51) Int. Cl.
*H01L 23/00* (2006.01)
*H01L 23/498* (2006.01)
*H01L 21/56* (2006.01)
*H01L 21/48* (2006.01)

(52) U.S. Cl.
CPC .......... *H01L 24/05* (2013.01); *H01L 21/4853* (2013.01); *H01L 21/56* (2013.01); *H01L 23/49811* (2013.01); *H01L 23/49838* (2013.01); *H01L 2224/023* (2013.01); *H01L 2224/05568* (2013.01)

(58) Field of Classification Search
None
See application file for complete search history.

(56) References Cited

U.S. PATENT DOCUMENTS 6,524,885 B2 * 2/2003 Pierce .................. H01L 23/525
257/E23.021
7,071,089 B1 * 7/2006 Lin ..................... H01L 21/4832
438/612

* cited by examiner

*Primary Examiner* — Michelle Mandala
(74) *Attorney, Agent, or Firm* — Richard B. Klar, Esq.; Law Office Richard B. Klar

(57) ABSTRACT

The present invention relates to a method and an apparatus for a resurfaceable contact pad that uses an epoxy to encapsulate contact pads so that the epoxy and encapsulated contact pads are coplanar on a silicon redistribution interposer. These redistribution interposers electrically connect a wafer semi-conductor to a probe card where it is necessary to convert the course pad arrangement of one with a fine pad arrangement of the other through the use of an interposer board. The present invention relates to an apparatus and a method creates resurfaceable contact pads which may be resurfaced one or multiple times with an abrasive sanding operation to recreate a coplanar surface should any contact pad surfaces become damaged, allowing for a more cost-effective repair.

9 Claims, 2 Drawing Sheets

RESURFACEABLE CONTACT PAD FOR SILICON OR ORGANIC REDISTRIBUTION INTERPOSER FOR SEMICONDUCTOR PROBING

BACKGROUND

1. Field

The present invention relates to a redistribution silicon or organic interposer. These redistribution interposers electrically connect a wafer semi-conductor to a probe card where it is necessary to convert the course pad arrangement of one with a fine pad arrangement of the other through the use of an interposer board. In particular the present invention relates to provide a method and structure for a resurfaceable contact pad using an epoxy to encapsulate contact pads such that the epoxy and encapsulated contact pads are coplanar on a silicon redistribution interposer.

2. The Related Art

Signal integrity probing requires good electrical connections. However, there are problems associated with extended use that may prevent good electrical connections from being formed with the contact surface to be probed. The contact surface that is the subject of the probing may become damaged by the probe needles over extended use. This damage from extended use will make it difficult if not impossible to affect a good probing contact and thus impair a good electrical connection, wherein the contact surfaces may need costly or time-consuming repairs or replacements.

SUMMARY

The present invention provides a method and structure for providing a resurfaceable contact pad using an epoxy to encapsulate contact pads such that the epoxy and encapsulated contact pads are coplanar on a silicon redistribution interposer having a main board 5. These redistribution interposers electrically connect a wafer semi-conductor to a probe card where it is necessary to convert the course pad arrangement of one with a fine pad arrangement of the other through the use of an interposer board. In particular, the present invention relates to an apparatus and a method for creating resurfaceable contact pads. The contact pads may be resurfaced one or multiple times with an abrasive sanding operation to recreate a coplanar surface should any contact pad surfaces become damaged, allowing for a more cost-effective repair.

DETAILED DESCRIPTION OF THE PREFERRED EMBODIMENT(S)

Figure 1:
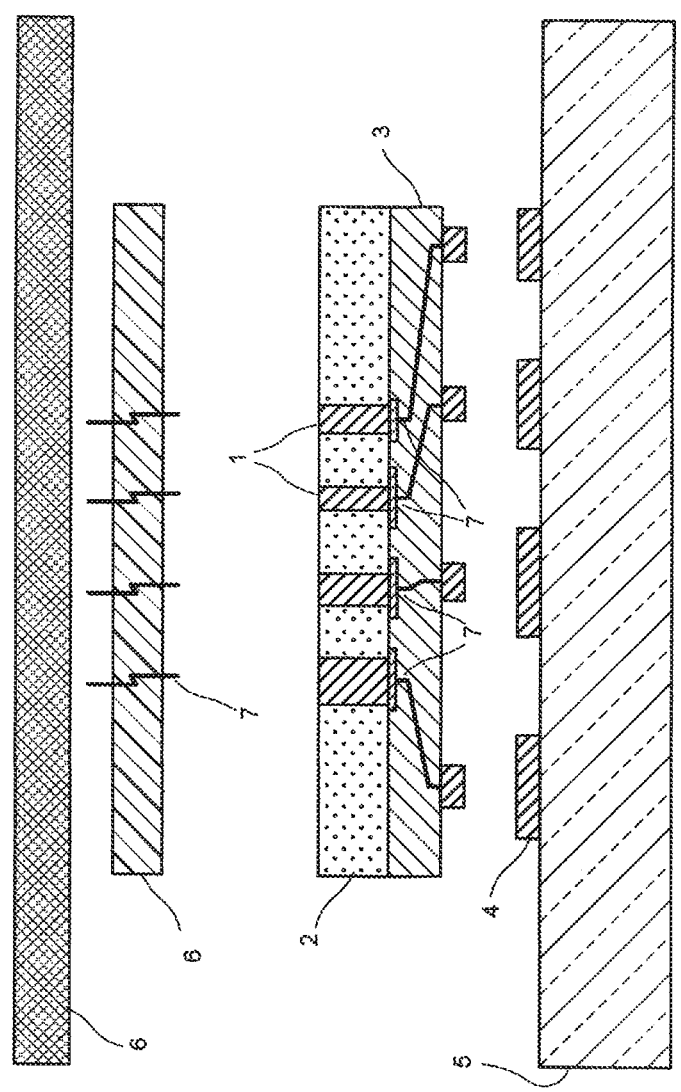
FIG. 1 illustrates an exploded sectional view of the present invention in which the redistribution silicon board contains a coplanar surface of connecting pads encapsulated with an epoxy.
Figure 2:
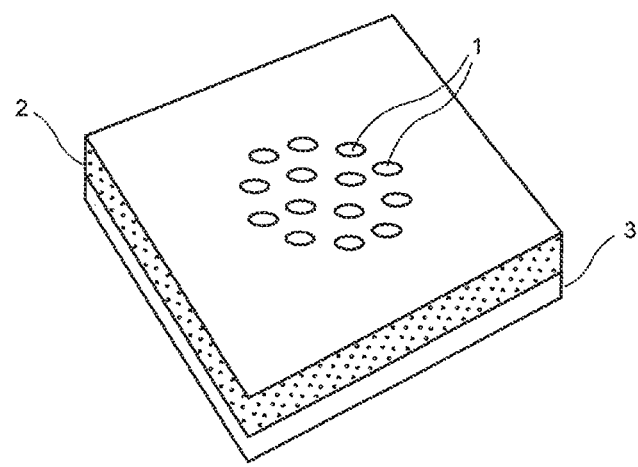
FIG. 2 shows a section view of the present invention where the redistribution interposer's surface contains connecting pads that are equally coplanar with an epoxy that encapsulates the connecting pads.

Referring now to the drawings of FIGS. 1-2, FIG. 1 illustrates the redistribution silicon, ceramic or organic interposer board 3 of the present invention having a main board 5 and the redistribution silicon, ceramic or organic interposer board 3 having top connecting lands or pads 7 in which the pads 7 are lengthened along the z axis by either an electro-plating or electro-less plating operation or by thermal-sonic gold ball bonding. In the case of lengthening by electroplating, a suitable temporary mask, of suitable thickness typically ranging from 0.0005" to 0.005" thick, such as a photo imageable plating mask is formed over the top surface of the interposer 3 exposing just the pads to be plated 7 The photo mask can be hot—roll laminated or spun on with a liquid resist, process known in the semiconductor industry. Then an electro-plating or electro-less plating operation, of a suitable wear resistant, low contact resistant preferably noble metal, is performed to build the pads 4 up to the desired height forming a column in a range of 5 micros to 25 microns. At this point the temporary mask 6 can be removed and an optional permanent epoxy 2 is formed around the plated columns, epoxy 2 formed by potted process or spin coating process. As an alternative to the temporary photo image-able mask 6 a photo image-able permanent epoxy can be used, coated or potted and being photo imageable the excess epoxy is developed away as known in the art. Once the epoxy is formed around the plated columns 1 they can both be sanded or lapped in the same plane to form a coplanar surface with a sanding process or lapping process as shown in the art, which can be re-sanded multiple times in the future after extended use or damage to the connecting pads, each time reducing the overall height of the column 7 to reform a flat coplanar pad. An alternative to the electroplating process would be thermal sonic or compression bonding of a suitable metal a compression bonder or a thermal sonic ball bonder, respectively, as typically use in the wire bonding industry such as gold to the contact pad 7, then forming epoxy around the gold ball/column or other suitable metal.

While presently preferred embodiments have been described for purposes of the disclosure, numerous changes in the arrangement of method steps and those skilled in the art can make apparatus parts. Such changes are encompassed within the spirit of the invention as defined by the appended claims.

What is claimed:

1. An apparatus for resurfaceable contact pads, comprising:
    an epoxy to encapsulate contact pads so that the epoxy and encapsulated contact pads are coplanar on a silicon redistribution interposer, said pads being formed by lengthening along a z-axis by one of either electro-plating, electro-less plating or thermal sonic bonding, said redistribution interposer being electrically connected to a wafer semi-conductor to a probe card where it is necessary to convert the course pad arrangement of one with a non-coarse pad arrangement of another one of said pads through the use of an interposer board, said resurfaceable contact pads having a coplanar surface formed by resurfacing one or more times with an abrasive sanding operation.

2. The apparatus for resurfaceable contact pads according to claim 1 wherein said conductive contact pads are encapsulated in an epoxy and said contact pads are equally coplanar with a surface of a surrounding epoxy.

3. The apparatus according to claim 1 wherein said pads are lengthened along a z axis by an electro-plating operation.

4. The apparatus according to claim 3 wherein a suitable temporary mask, of suitable thickness approximately ranging from 0.0005 " to 0.005" thick, such as a photo image-able plating mask is formed over a top surface of the interposer exposing just the pads to be plated and the pads are built up to a designated height forming a column by an electro-plating operation, of a wear resistant, contact resistant having a resistant that approximates that of a noble metal, is performed and the temporary mask is removed and a permanent epoxy is formed around the plated columns.

5. The apparatus according to claim 1 wherein said pads are lengthened along a z axis by an electro-less plating operation.

6. The apparatus according to claim 3 wherein a suitable temporary mask, of suitable thickness typically ranging from 0.0005" to 0.005" thick, such as a photo image-able plating mask is formed over a top surface of the interposer exposing just the pads to be plated and the pads are built up to a designated height forming a column by an electro-less plating operation, of a wear resistant, contact resistant having a resistant that approximates a resistant of a noble metal, is performed and the temporary mask is removed and a permanent epoxy is formed around the plated columns.

7. The apparatus according to claim 1 wherein said pads are lengthened along a z axis by a thermal-sonic gold ball bonding electro-plating operation.

8. The apparatus according to claim 3 wherein instead of a temporary photo image-able mask, a photo image-able permanent epoxy can be used.

9. The apparatus according to claim 5 wherein instead of a temporary photo image-able mask, a photo image-able permanent epoxy can be used.

* * * * *

UNITED STATES PATENT AND TRADEMARK OFFICE
CERTIFICATE OF CORRECTION

PATENT NO. : 9,978,702 B2
APPLICATION NO. : 15/151658
DATED : May 22, 2018
INVENTOR(S) : James V. Russell Page 1 of 1

It is certified that error appears in the above-identified patent and that said Letters Patent is hereby corrected as shown below:

Please correct the Assignee name to read as follows:

(73) Assignee: R&D Circuits, Inc., South Plainfield, NJ (US)

Signed and Sealed this
Fourteenth Day of August, 2018

Andrei Iancu
*Director of the United States Patent and Trademark Office*